United States Patent
Suga et al.

(10) Patent No.: US 9,269,853 B2
(45) Date of Patent: Feb. 23, 2016

(54) LUMINESCENT DEVICE, OPTICAL COHERENCE TOMOGRAPHIC IMAGING APPARATUS PROVIDED WITH THE LUMINESCENT DEVICE AND CONTROL METHOD OF THE LUMINESCENT DEVICE

(71) Applicant: CANON KABUSHIKI KAISHA, Tokyo (JP)

(72) Inventors: Takako Suga, Yokohama (JP); Mamoru Uchida, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 26 days.

(21) Appl. No.: 14/097,680

(22) Filed: Dec. 5, 2013

(65) Prior Publication Data
US 2014/0168656 A1 Jun. 19, 2014

(30) Foreign Application Priority Data
Dec. 17, 2012 (JP) .................................. 2012-275123

(51) Int. Cl.
*G01B 9/02* (2006.01)
*H01L 33/00* (2010.01)

(52) U.S. Cl.
CPC ........ *H01L 33/0045* (2013.01); *G01B 9/02091* (2013.01)

(58) Field of Classification Search
CPC ....... G01J 1/4257; H01S 5/0264; H01S 5/026
See application file for complete search history.

(56) References Cited

U.S. PATENT DOCUMENTS

| | | | |
|---|---|---|---|
| 5,126,803 A * | 6/1992 | Hager et al. | 257/94 |
| 5,321,501 A * | 6/1994 | Swanson et al. | 356/479 |
| 5,699,373 A | 12/1997 | Uchida et al. | |
| 6,184,542 B1 * | 2/2001 | Alphonse | 257/94 |
| 6,714,566 B1 * | 3/2004 | Coldren et al. | 372/20 |
| 6,977,820 B2 | 12/2005 | Uchida | |
| 7,386,200 B2 | 6/2008 | Uchida | |
| 7,731,902 B2 | 6/2010 | Nagatomo et al. | |
| 7,809,040 B2 | 10/2010 | Takeuchi et al. | |
| 8,116,344 B2 | 2/2012 | Takeuchi et al. | |
| 2002/0146049 A1 * | 10/2002 | Capasso et al. | 372/44 |
| 2004/0086008 A1 * | 5/2004 | Gregory et al. | 372/34 |
| 2013/0056621 A1 | 3/2013 | Suga et al. | |
| 2014/0217425 A1 * | 8/2014 | Kopp et al. | 257/84 |

OTHER PUBLICATIONS

A.T. Semenov et al., "Spectral Control in Multisection AlGaAs SQW Super Luminescent Diodes at 800 nm" Electronics Letters, vol. 32, No. 3 p. 255 (1996).

\* cited by examiner

*Primary Examiner* — Gregory J Toatley
*Assistant Examiner* — Shawn Decenzo
(74) *Attorney, Agent, or Firm* — Fitzpatrick, Cella, Harper & Scinto

(57) ABSTRACT

A luminescent device including an upper electrode layer, a lower electrode layer and an active layer provided between these electrode layers, the device having such a structure that at least one electrode layer of the upper electrode layer and the lower electrode layer is provided in an in-plane direction of the active layer being divided into plural electrodes, current is injected into plural different regions of the active layer by the plural electrodes to cause emission in plural luminescent regions, and light emitted from one luminescent region of the plural luminescent regions enters in another luminescent region and exits. The device further includes a light receiving portion for detecting light that is emitted from one luminescent region of the plural luminescent regions and does not go through another luminescent region.

13 Claims, 12 Drawing Sheets

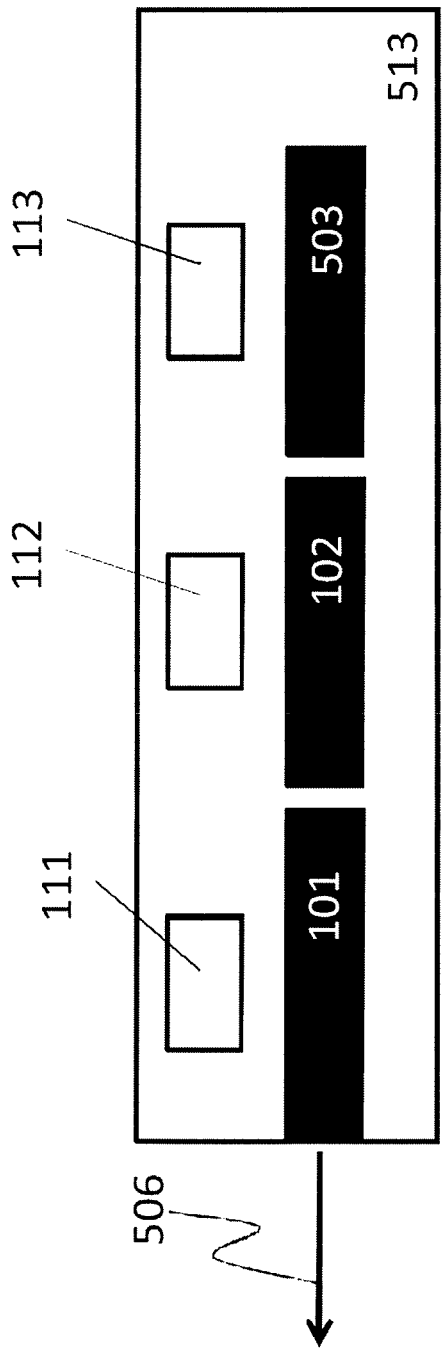

|  | 901(mA) | 902(mA) | OPTICAL OUTPUT (mW) | HALF WIDTH (nm) |
|---|---|---|---|---|
| (i) | 180 | 180 | 10 | 21 |
| (ii) | 250 | 0 | 8 | 18.5 |
| (iii) | 250 | 110 | 23 | 60 |
| (iv) | 140 | 0 | 2 | 66 |

LUMINESCENT DEVICE, OPTICAL COHERENCE TOMOGRAPHIC IMAGING APPARATUS PROVIDED WITH THE LUMINESCENT DEVICE AND CONTROL METHOD OF THE LUMINESCENT DEVICE

BACKGROUND OF THE INVENTION

1. Field of the Invention

The present invention relates to a luminescent device, an optical coherence tomographic imaging apparatus provided with the luminescent device and a control method of the luminescent device.

2. Description of the Related Art

In recent years, attention has been attracted to a super luminescent diode (hereinafter abbreviated as SLD) that is a luminescent device.

The SLD mixedly uses both stimulated and amplified light and spontaneously emitted light unlike a semiconductor laser by which light with high output and very narrow spectral width is oscillated with a low injection current by using stimulated amplification and further resonating the light and unlike an LED which utilizes spontaneously emitted light and is wide in radiation angle.

A feature of this SLD resides in that the output is high compared with the LED and a wide spectrum half width compared with the semiconductor laser is obtained by constructing it so as not to undergo resonation even in a highly current-injected state. The SLD is widely applied to many uses such as a spectroscope, a length measuring machine, a refractive index distribution measuring device, a tomographic imaging apparatus and a light source for excitation by making good use of such a feature.

When such an SLD is used in the above-described application devices and the optical output and spectral form thereof are controlled, a method in which SLD light to be used is split and detected and a method in which light from an exit face opposite to a face to utilize SLD light used is detected and controlled are considered.

In the present specification, the light which does not undergo resonation even in a highly current-injected state and is stimulated and amplified is called SLD light.

Even in light emitted from the same active layer region, a spontaneously emitted light component and an SLD light component are present. In the present specification, these are separately described.

Specific examples of a position of a detector regarding control of SLD light are illustrated in FIGS. 8A and 8B. FIG. 8A illustrates a construction that SLD light 806 emitted from an SLD device 805 whose upper electrode is a single electrode structure is branched by means of a branching mirror 802. The SLD light 806 is divided into SLD light 803 to be used and light 804 entering in a detector 811, and a current injection amount to the upper electrode is controlled on the basis of a signal detected in the detector 811, whereby the optical output and spectral form of the SLD light are adjusted.

In FIG. 8B, SLD light 807 emitted from the side opposing an exit side of the SLD light 806 is detected in a detector 812, and a current injection amount to the upper electrode is controlled on the basis of a signal detected in the detector 812, whereby the optical output and spectral form of the SLD light are adjusted.

On the other hand, as described in A. T. Semenov, V. R. Shidlovski, D. A. Jakson, R. willsch and W. Ecke, "Spectral control in multisection AlGaAs SQW super luminescent diodes at 800 nm" ELECTRONICS LETTERS, Vol. 32, No. 3, p. 255 (1996) (Non Patent Literature 1), an attempt to use plural upper electrodes and independently control current injection amounts to the respective electrodes is made for realizing higher output and wider spectrum half width at the same time.

Here, the structure described in Non Patent Literature 1 is described with reference to FIG. 9A. An SLD device is composed of a ridge waveguide structure and an AlGaAs heterostructure having an 8 nm thick quantum well active layer (not illustrated).

In addition, the device has three upper electrodes 901, 902 and 902 each having a length of 500 μm. Among these electrodes, an upper electrode close to the side of an exit face of SLD light 906 is the first electrode 901. An electrode located at the center is the second electrode 902, and an electrode arranged on the side of another exit face 905 is the third electrode 903. In this Literature, current is applied to only the first electrode 901 and the second electrode 902, and the third electrode 903 is used as a light absorbing region without applying current (in other words, the end face 905 neither exits light not reflects light). FIG. 9B shows optical outputs and spectrum half widths of the SLD light 906 when current is injected into the respective upper electrodes. It is understood that the values of the optical outputs and spectrum half widths are greatly varied according to the amount of the current injected into the respective upper electrodes 901 and 902.

In addition, in Non Patent Literature 1, spectral forms under conditions (i) to (iv) are illustrated in FIG. 2, it is disclosed that the spectral form is also greatly varied according to the amount of the current injected into the respective electrodes.

However, the prior art structure described in Non Patent Literature 1 involves the following problems.

That is to say, in the case of the SLD having the plural upper electrode structure described in Non Patent Literature 1, it is difficult to take the same method as in a single electrode structure for respectively determining optimum amounts of the current injected into the plural upper electrodes to control both optical output and spectral form.

For example, when a case where a method of branching SLD light to be used and using a part thereof for monitoring (corresponding to FIG. 8A) is applied to the plural electrode structure is supposed, the following problem is caused.

Since the spectral form greatly vary due to a difference between the amounts of the current injected into the respective electrodes as described above, it is necessary to monitor not only the output of the SLD exiting light, but also the spectral form, so that the detector 811 is required to have a function as a spectrum analyzer, and at the same time it takes a time to exactly reset all current amounts injected into the plural electrodes when driving conditions deviate from initially set values due to some cause.

In addition, when a method of monitoring SLD light exiting from a face opposite to a face to use the SLD light (corresponding to FIG. 8B) is supposed, the following problem is caused.

Since carrier densities of respective electrodes are different when plural electrodes are used, the spectrum of stimulated and emitted light also has a distribution in a waveguide direction. Accordingly, since the same optical output and spectral form as the SLD light used are not obtained from the opposite exit face, exact feedback cannot be conducted even when the SLD light exiting from the opposite face is monitored.

SUMMARY OF THE INVENTION

The present invention has been made in view of the foregoing problems and has as its object the provision of a luminescent device by which the optical output and spectral form of exiting light can be simply controlled in a short period of time with good accuracy when an upper electrode or lower electrode is formed of plural electrodes, an optical coherence tomographic imaging apparatus provided with the luminescent device, and a control method of the luminescent device.

According to the present invention, there is provided a luminescent device comprising an upper electrode layer, a lower electrode layer and an active layer provided between these electrode layers, the device having such a structure that at least one electrode layer of the upper electrode layer and the lower electrode layer is provided in an in-plane direction of the active layer being divided into plural electrodes, current is injected into plural different regions of the active layer by the plural electrodes to cause emission in plural luminescent regions, and light emitted from one luminescent region of the plural luminescent regions enters in another luminescent region and exits, wherein the device further comprises a light receiving portion for detecting light that is emitted from one luminescent region of the plural luminescent regions and does not go through another luminescent region.

According to the present invention, there is also provided an optical coherence tomographic imaging apparatus comprising the luminescent device described above as a light source portion, a sample measurement portion which applies light from the light source portion to a sample and transmits reflected light from the sample, a reference portion which applies light from the light source to a reference mirror and transmits reflected light from the reference mirror, an interference portion which causes the reflected light from the sample measurement portion and the reflected light from the reference portion to interfere with each other, a light detection portion which detects interference light from the interference portion, and an image processing portion which obtains a tomographic image of the sample on the basis of light detected at the light detection portion.

According to the present invention, there is further provided a control method of a luminescent device for controlling an optical output and a spectral form in the luminescent device described above, the method comprising the steps of: providing a table or an operation expression as to the relationship of an intensity value detected by the light receiving portion with respect to the optical output and spectrum half width of the luminescent device, determining a range of the value detected by the light receiving portion under a condition of using the light of the luminescent device, and adjusting an amount of current to be injected into the upper electrode or the lower electrode on the basis of the table or the operation expression in such a manner that the value detected by the light receiving portion falls within the above range.

Further features of the present invention will become apparent from the following description of exemplary embodiments with reference to the attached drawings.

BRIEF DESCRIPTION OF THE DRAWINGS

FIG. 5 illustrates another constructional example of an upper electrode in the embodiment of the present invention.

DESCRIPTION OF THE EMBODIMENTS

Figure 1A:
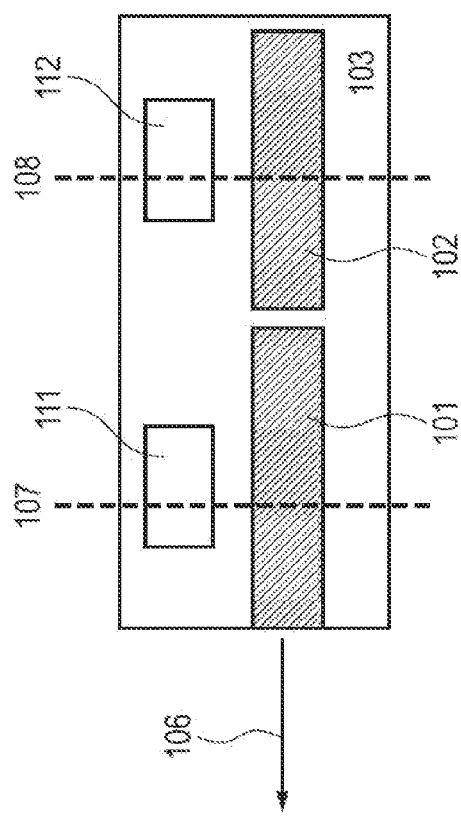
FIGS. 1A, 1B and 1C illustrate a constructional example of an SLD according to an embodiment of the present invention.

Preferred embodiments of the present invention will now be described in detail in accordance with the accompanying drawings.

The luminescent device according to an embodiment of the present invention has an upper electrode layer, a lower electrode layer and an active layer provided between these electrode layers, and has a multi-electrode structure in which at least one electrode layer of the upper electrode layer and the lower electrode layer is provided in an in-plane direction of the active layer being divided into plural electrodes.

The luminescent device according to this embodiment is so constructed that current is injected into plural different regions of the active layer by the dividedly provided plural electrodes to cause emission in plural luminescent regions, and light emitted from one luminescent region (luminescent region A) of the plural luminescent regions enters in another luminescent region (luminescent region B) and exits. Here, the currents injected into the luminescent region A and the luminescent region B are adjusted, whereby wavelength ranges of light emitted from the luminescent region A and the luminescent region B are different. Therefore, when the luminescent region B is present at an exit end, a wavelength band of exiting light is a wavelength band of light obtained by combining the light emitted from the luminescent region B and the light emitted from the luminescent region A to go (transmit) through the luminescent region B. Accordingly, by providing such a multi-electrode structure, the wavelength band of the exiting light can be made wide compared with a luminescent device having only one luminescent region.

In addition, the luminescent device according to this embodiment has such a feature that the device further has a light receiving portion for detecting light which is emitted from one luminescent region of the plural luminescent regions and does not go through another luminescent region.

The wavelength band of the combined light varies according to current injection amounts into the luminescent regions A and B. Therefore, when a spectrum of the combined light (light including stimulated and amplified light, SLD light) is not appropriate, it may not be seen in some cases that it is better to change a current injection amount into any of the luminescent regions A and B. Thus, in the luminescent device according to this embodiment, light which is emitted from a certain luminescent region of the plural luminescent regions and does not go through another luminescent region (mainly, spontaneously emitted light) is detected, whereby the form itself of an emission spectrum from the certain luminescent region is observed. The light receiving portion is provided at such a position that at least one of the light which is emitted from a certain luminescent region (luminescent region A) and does not go through another luminescent region (luminescent region B) and the light which is emitted from the luminescent region B and does not go through the luminescent region A can be detected. Plural light receiving portions may be respectively provided at the plural luminescent regions for detecting respective lights which are emitted from the respective luminescent regions and do not go through other luminescent regions. Since the intensity of spontaneously emitted light is generally weak, the light receiving portion is favorably provided closely to the luminescent region.

The luminescent device according to this embodiment may be so constructed that an optical waveguide is formed of a lower cladding layer provided between the active layer and the lower electrode layer and an upper cladding layer provided between the active layer and the upper electrode layer. With this optical waveguide in which the active layer is provided, light can be confined and guided.

In addition, a control portion which controls a current injected into the active layer according to the intensity of the light detected by the light receiving portion is favorably provided. For example, a table showing the correspondence relationship between the intensity of light finally exited from the luminescent device and the intensity of light detected by the light receiving portion is provided, thereby performing such a control that the current injection amount is increased when the intensity of the light detected by the light receiving portion is insufficient or is decreased when such intensity is excessive to the contrary.

Such a luminescent device according to this embodiment as described above can be suitably applied to a super luminescent diode.

The luminescent device according to the embodiment of the present invention will hereinafter be described in detail.

SLD that is a luminescent device according to the embodiment of the present invention has plural upper electrodes or lower electrodes and is so constructed that light receivers for monitoring spontaneously emitted light from respective luminescent regions corresponding to these plural electrodes are arranged correspondingly to the respective luminescent regions.

In the SLD according to this embodiment, such a construction permits simply controlling the optical output and spectral form of SLD light at the same time in a short period of time with good accuracy.

This is based on finding by the present inventors which will be described below.

The present inventors have carried out an extensive investigation. As a result, it has been found effective to use such a structure that plural quantum levels different in luminescent energy level are present and a dominant luminescence peak in spectral intensity is shifted from a long-wavelength side level to a shorter-wavelength side level by increase in injected density of carrier, as an active layer of SLD which realizes high output of SLD light and wide band of the spectral form thereof at the same time by using the plural electrode structure.

An example in which such an active layer is used will now be described.

Here, an upper electrode close to an end face on a light extraction side of longitudinal end faces of an optical waveguide layer is referred to as a front electrode, and another electrode more distant from the light extraction side than the front electrode is referred to as a rear electrode.

Current is highly injected into this front electrode in such a manner that luminescence from, for example, a first level (level on a short-wavelength side) is dominant, and current is poorly injected into the rear electrode in such a manner that luminescence from, for example, a second level (level on a long-wavelength side) is dominant.

When such condition is applied, waveguide light generated in an active layer region corresponding to the rear electrode is guided to an active layer region corresponding to the front electrode, whereby the intensity of a wavelength range lower in energy (long-wavelength side) is amplified in the active layer region corresponding to the front electrode, the intensity of a wavelength range high in energy (short-wavelength side, luminescence from the first level) is obtained by current injection into the front electrode, and then both are combined. Accordingly, it is supposed that the high output and wide band of the SLD light can be consequently realized at the same time.

Figure 3B:
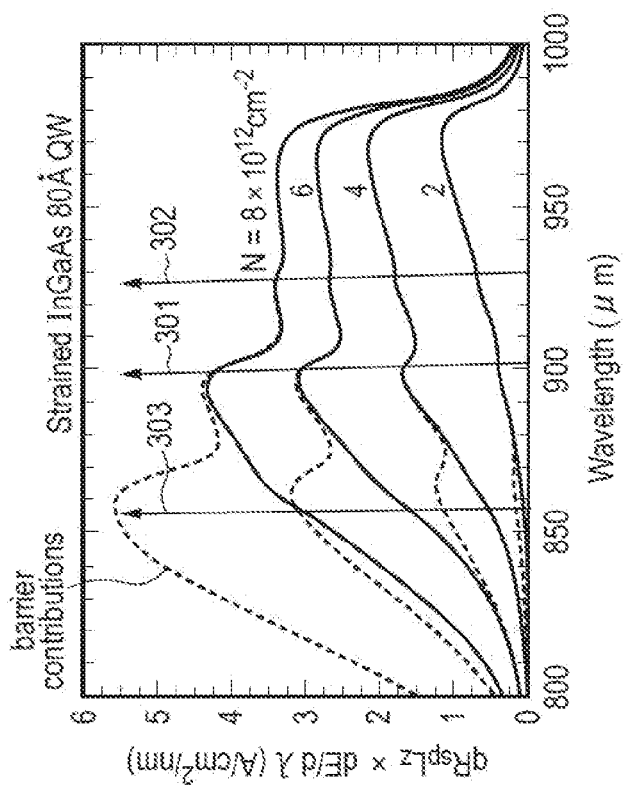
FIGS. 3A and 3B illustrate the relationship between the magnitude of gain and a density of carrier and the relationship between a density of carrier and the intensity of spontaneously emitted light in the embodiment of the present invention, respectively.
Figure 3A:
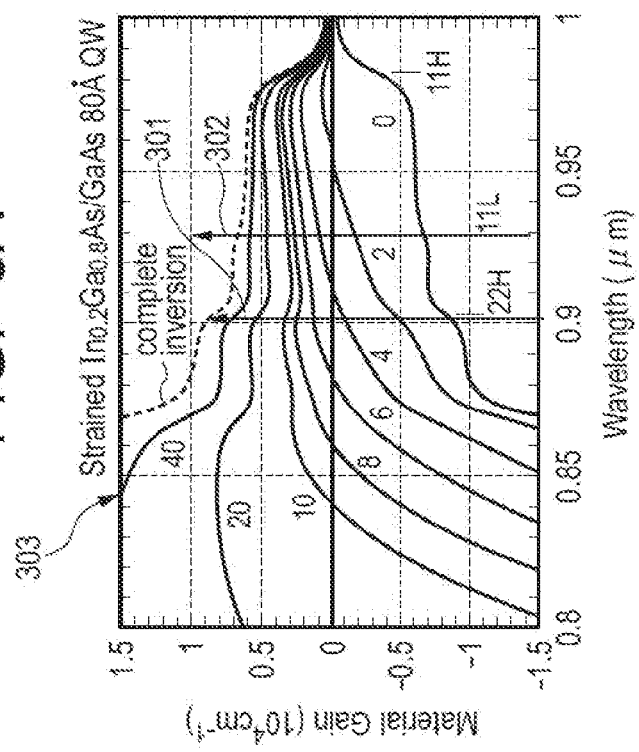

FIGS. 3A and 3B illustrate the relationship between the magnitude of gain of an active layer having a strained quantum well structure and a density of carrier and the relationship between a density of carrier and the intensity of spontaneously emitted light, respectively. In FIGS. 3A and 3B, an emission wavelength from a heavy hole of a ground level, an emission wavelength from a light hole of the ground level, and an emission wavelength from a primary level are indicated by a solid line 301, a solid line 302 and a solid line 303, respectively.

It is understood from FIG. 3A that the magnitude of gain is related to the density of carrier, and it is understood from FIG. 3B that the density of carrier is related to the intensity of the spontaneously emitted light. It is further understood that the intensity of the spontaneously emitted light from the primary level (level of the short-wavelength side; first level) sensitively varies according to change in the density of carrier.

Accordingly, the intensity of spontaneously emitted light from the active layer region corresponding to the front electrode in particular is measured under the condition that the high output and wide band of the SLD light are achieved using the plural upper electrodes or lower electrodes, which has been found by the present inventors, whereby change in carrier current density can be grasped with high accuracy. To the contrary, amounts of currents injected into the respective upper electrodes are adjusted in such a manner that the intensity of the spontaneously emitted light becomes constant, whereby the light intensity and spectral form of the SLD light can be controlled at a high speed with high accuracy.

The example where luminescence from the primary level is dominant in the front electrode and luminescence from the ground level is dominant in the rear electrode has been described above as an example of the active layer. However, the present invention is not limited thereto.

As another example, there is an example where an asymmetric multiple quantum well structure is used as the active layer.

The asymmetric multiple quantum well structure is such a structure that plural quantum wells different in composition or film thickness are arranged in the active layer.

Accordingly, for example, ground levels of the respective quantum wells are used, whereby a peak of an emission spectrum can be shifted from the long-wavelength side level to the short-wavelength side level with increasing injected density of carrier.

Figure 1B:
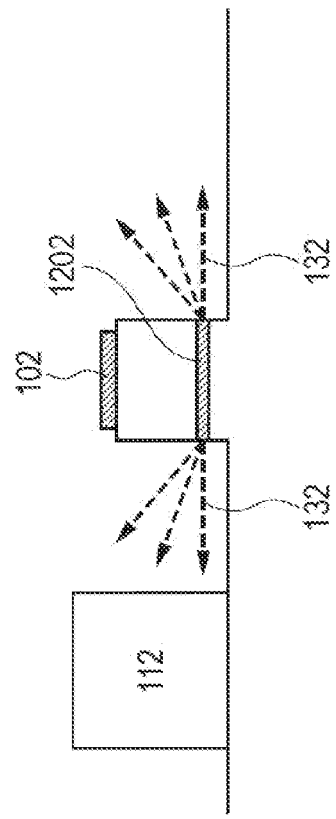
Figure 1C:
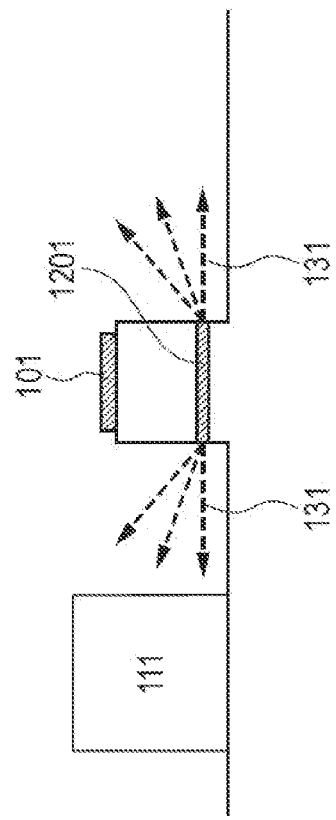

A specific construction of this embodiment will now be described with reference to FIGS. 1A to 1C. In FIGS. 1A to 1C, FIG. 1A illustrates an SLD device 103 according to the present invention when viewed from above, FIG. 1B is a cross-sectional view taken along the dotted line 107 in FIG. 1A, and FIG. 1C is a cross-sectional view taken along the dotted line 108 in FIG. 1A.

Here, a case where two upper electrodes are used as the plural electrodes is described.

The SLD element 103 is constructed by a lower electrode, a substrate, a cladding layer having a first polarity, an active layer, another cladding layer having a second polarity, a contact layer having the second polarity and two upper electrodes which are electrically independent. An optical waveguide layer is formed by the active layer and the cladding layers located on and under the active layer.

Here, an upper electrode close to an exit end side of SLD light 106 in a longitudinal direction of the optical waveguide layer is called a front electrode 101, and an electrode remote from the exit end side is called a rear electrode 102. A lower common electrode (not illustrated) is arranged on a back surface of the substrate.

In the SLD device 103, light receiving portions 111 and 112 respectively detecting spontaneously emitted light components 131 and 132 from the active layer 120 (see FIG. 10) are further arranged in the vicinity of the respective electrodes. Here, when an active layer region of a region into which current is injected by applying current to the front electrode 101 is referred to as a first active layer region 1201 and an active layer region of a region into which current is injected by applying current to the rear electrode 102 is referred to as a second active layer region 1202, both spontaneously emitted light and stimulated and emitted light are generated in both active layer regions. Since the spontaneously emitted light is amplified while being guided to the optical waveguide, the spontaneously emitted light does not exit out of the optical waveguide but is also emitted out of the optical waveguide because it does not have directivity in principle.

Since the two light receiving portions are respectively arranged close to a first light emitting portion and a second light emitting portion, the spontaneously emitted light component 131 and the spontaneously emitted light component 132 correspond to spontaneously emitted light component from the active layer region 1201 and that from the active layer region 1202, respectively.

The light receiving portions 111 and 112 may be arranged at any positions so far as the intensities of the spontaneously emitted light components from the respective active layer regions 1201 and 1202 can be detected. In FIG. 1A, a case where light detectors are arranged over the SLD device 103 is illustrated, however, not limited thereto. More specifically, the light detector may be arranged at a position on a concentric circle with the position of the active layer as the center to correspond to a direction perpendicular to an exiting direction of the SLD light, i.e. horizontal direction in FIG. 1A (excluding a substrate side and an upper side of the upper electrode).

The light receiving portion is desirably arranged as close as possible to its corresponding active layer in such a manner that the spontaneously emitted light can be efficiently detected.

The area of a light receiving region is favorably wider. However, the area is desirably set so as not to detect the intensity of the spontaneously emitted light from the other active layer region (for example, the active layer region 1202) close to one active layer region (for example, the active layer region 1201) to be detected. Therefore, the light receiving portion is more favorably arranged at a center position of the length with respect to the exiting direction of the SLD light for its corresponding active layer region.

In addition, the light receiving portion is favorably arranged away from an adjacent active layer region by a distance of more than at least a distance between a light receiving face of the light receiving portion and its corresponding active layer region.

In addition, it is favorable to apply a method of covering only a region close to another adjacent active layer region of an active layer region with a light shielding member or of providing an optical filter (wavelength filter) between its corresponding active layer region and the light receiving portion in such a manner that its corresponding spontaneously emitted light component can be selectively detected.

Here, in a light source for the plural-electrode SLD having the light receiving portions for detecting the spontaneously emitted light components from the respective light emitting regions, a control method of the SLD by controlling an injection current into the respective upper electrodes to control the optical output and spectral form of the SLD is described with reference to FIGS. 11A and 11B.

In the constructional example of this embodiment, a case where plural electrodes are provided as upper electrodes, not as lower electrodes, and luminescence from a ground level and a primary level becomes a main peak in the active layer will be described. However, the present invention is not limited thereto.

For an initial state, the current injection amount into the front electrode 101 is first adjusted while monitoring the intensity of the SLD light and the value of the front-side light receiving portion 111 so as to obtain desired optical output of the SLD light.

Figure 11B:
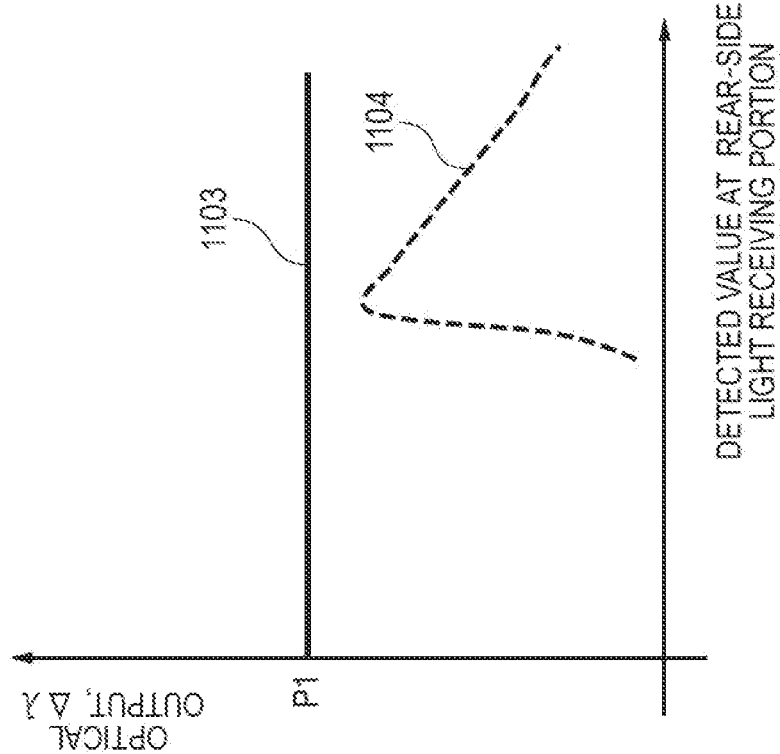
FIGS. 11A and 11B illustrate a control method of a current injected into respective upper electrodes in the SLD according to the embodiment of the present invention.
Figure 11A:
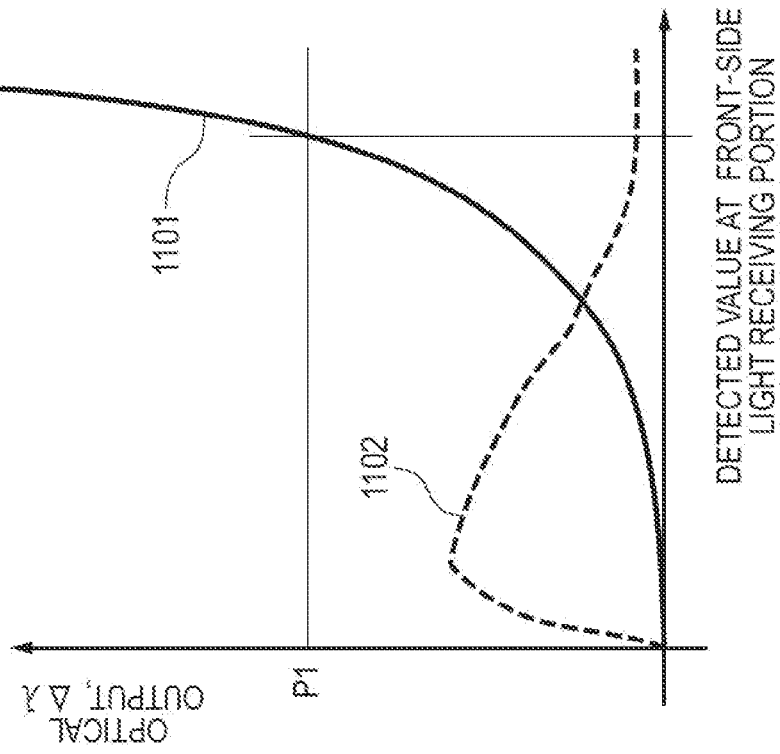

FIG. 11A illustrates a case where current is injected into only the front electrode 101. The solid line 1101 indicates optical output of the SLD light, and the dotted line 1102 indicates a spectrum half width of the SLD light. As illustrated in FIG. 11A, wide band of the spectrum can be realized by injecting the current into only the front electrode 101 when desired optical output can be small.

When desired optical output is large, wide band of the spectrum can be realized by also injecting a current into the rear electrode 102 in addition to injection of high current into the front electrode 101. At this time, luminescence from the corresponding active region 1201 is adjusted in such a manner that luminescence from the short-wavelength side (from the primary level in this embodiment) becomes main.

Current is then injected into the rear electrode 102 at the optical output P1 in such a manner that a desired spectral form of the SLD light is obtained.

FIG. 11B illustrates a value detected at the rear-side light receiving portion (light detector) 112 as well as optical output of the SLD light indicated by the solid line 1103 and a spectrum half width indicated by the dotted line 1104 when current is further injected into the rear electrode 102 after the state where the optical output P1 has been realized by the current injection into only the front electrode 101.

The current injection amounts into the respective upper electrodes are changed, whereby change in the intensity of the spontaneously emitted light corresponding to the luminescence mainly from the short-wavelength side (from the primary level in this embodiment) is detected at the front-side light receiving portion 111, and change in the intensity of the spontaneously emitted light corresponding to the luminescence mainly from the long-wavelength side (from the ground level in this embodiment) is detected at the rear-side light receiving portion 112.

Here, in the front-side light receiving portion 111, a spontaneously emitted light component due to luminescence from the long-wavelength side and luminescence caused by carrier injection by light obtained by guiding light generated in the rear-side active layer region 1202 is also included. However, the change in the intensity of the spontaneously emitted light component by the luminescence from the primary level is dominant in the change of the strength thereof as illustrated in FIGS. 3A and 3B.

When control is made with reference to the values detected at the respective light detectors in a state where current has been injected into the plural upper electrodes at the same time, there is a possibility that mutual influence by the upper electrodes is exerted on the intensity of the spontaneously emitted light, so that detection accuracy thereof is lowered. However, this embodiment has such an effect that the adjustment can be made in a short period of time (real time).

As an actual control method, a table as to the relationship of the optical output and spectrum half width of the SLD light with respect to the value from the front-side light receiving portion 111 and the value from the rear-side light receiving portion 112 is first prepared to refer to the table for the control.

Specifically, respective ranges of values detected at the light detectors are determined under respective conditions to use the SLD light, and current injection amounts into the respective upper electrodes or lower electrodes are adjusted on the basis of the table in such a manner that the values detected at the respective light detectors fall within the respective ranges. At this time, an operation expression representing the relationship between them may be provided in place of the table to refer to the operation expression.

The magnitude relation of the current injection amounts into the upper electrodes is almost the same as that of the values from the light detectors. Accordingly, when the detected values from the respective light detectors deviate from the initial state during use of the SLD light, the current injection amounts into the respective upper electrodes are controlled on the based of the table or operation expression according to the deviation direction in such a manner that the detected values from the respective light receiving portions become the initial state. Alternatively, the current injection amounts into the respective upper electrodes are controlled so as to fall within a range of predetermined specified values.

The table or operation expression is prepared in advance, whereby the control can be made in a shorter period of time because a way of control is understood.

Change in the optical output of the SLD light tends to mainly affect change in the front-side light receiving portion 111, and change in the spectrum half width of the SLD light tends to mainly affect change in the rear-side light receiving portion 112. When a light detecting mechanism for spontaneously emitted light, by which emission intensities from plural levels can be separately detected, is provided on the front side, accuracy for control of the SLD light can be enhanced. On the other hand, a method of changing the timing of the current injected into the plural upper electrodes to control the current injection amounts may also be adopted. At this time, for the current injection amounts for injection into the respective upper electrodes at the same time, a table representing the relationship of the optical output and spectrum half width of the SLD light with respect to the values from the respective light receiving portions when current is injected into the respective upper electrodes at different times is prepared to refer to the table for the control. Alternatively, an operation expression representing the relationship between them is provided, and the control can be made by using the operation expression. According to this method, it takes a time for the control. However, the control can be made with high accuracy.

When the temperature of the SLD device is fixedly controlled by, for example, a Peltier device, it is not necessary to consider influence of change by the temperature. However, when the environment temperature is changed, optical output is greatly changed with respect to a fixed current injection amount. Therefore, it is necessary to grasp the relationship between the values of the respective light detectors, particularly, the value of the front-side light receiving portion 111, and change in the optical output of the SLD light with the environmental temperature. When the SLD device is actually used by utilizing the SLD light, changes in the optical output and spectral form of the SLD light occur with the state change of the SLD device.

Such changes can be indirectly grasped by detecting the spontaneously emitted light components from the active layer regions into which current has been injected from the respective upper electrodes.

When signals from the respective light detectors change, the current injection amounts into the respective upper electrodes are adjusted by using the operation expression or table prepared at the initial stage in such a manner that the signals from the respective light detectors become the initial state.

At this time, it is favorable that the current injection amount into the front electrode 101 is first adjusted, and the current injection amount into the rear electrode 102 is then adjusted.

Since higher current is generally injected into the front electrode 101 than into the rear electrode 102, it is expected that the active layer region 1201 corresponding to the front electrode 101 is earliest damaged and changed.

Accordingly, the condition of the front side is first adjusted, and the condition of the rear side is then adjusted, whereby the current injection amounts into the plural electrodes can be adjusted in a short period of time.

Although the case where a part of the active layer in the plural luminescent regions is provided with a common structure and only the upper electrodes are electrically independent has been described above, the present invention is not limited thereto, and two SLD devices may be arranged.

In such a case, positions of the two devices are adjusted in such a manner that light generated from at least one SLD device to exit from an end face of a substrate enters in an active layer of another SLD device.

In addition, the case where the two upper electrodes are used has been described as a specific example above. However, the present invention is not limited thereto, and such a construction that three upper electrodes are used as illustrated in FIG. 5 may be adopted, or more than three upper electrodes may be used.

In such cases, an upper electrode located on an exit face side of SLD light 506 is referred to as a front electrode 101, and the other electrodes are referred to as a first rear electrode 102, a second rear electrode 103, from one closest to the exit face.

In addition, light detectors 111, 112, 113, for respectively detecting the intensities of spontaneously emitted light components from active layer regions into which current is injected from the respective upper electrodes are arranged.

As described above, current injection is conducted to an active layer region into which current is injected from the front electrode 101 in such a manner that luminescence from a short-wavelength side is dominant, and current injection is conducted to an active layer region into which current is injected from the first rear electrode 102 in such a manner that luminescence from a long-wavelength side is dominant. High output and wide band of the SLD light 506 can be thereby realized.

Current injection is further conducted to an active layer region into which current is injected from the second rear electrode 103, whereby wider band of the SLD light 506 can be realized. It is however difficult to control current injection amounts into the respective upper electrodes from only the characteristics of the SLD light 506. Thus, light receiving portions are provided to the respective upper electrodes, and the current injection amounts into the respective upper electrodes are adjusted on the basis of values detected at the respective light receiving portions, whereby high-speed control can be made with better accuracy.

The control of the rear electrode has been described above from the viewpoint of adjusting the current injection amount in a forward direction like the front electrode. However, the present invention is not limited thereto.

Specifically, even when a method of injecting no current into at least one electrode of the rear electrodes (zero bias) or applying a reverse bias thereto is used, the spectrum half width of the SLD light can be made a wide bond according to conditions thereof. Even in this case, injection current into the respective electrodes are controlled on the basis of the values detected at the light receiving portions, whereby the injection current into the plural electrodes can be controlled at a high speed with good accuracy.

Example 1

A constructional example where an optical filter is provided between a luminescent region closest to an end face on a light extraction side of longitudinal end faces of an optical waveguide layer and a light receiving portion for detecting an amount of spontaneously emitted light from this luminescent region is described as Example 1.

Figure 2A:
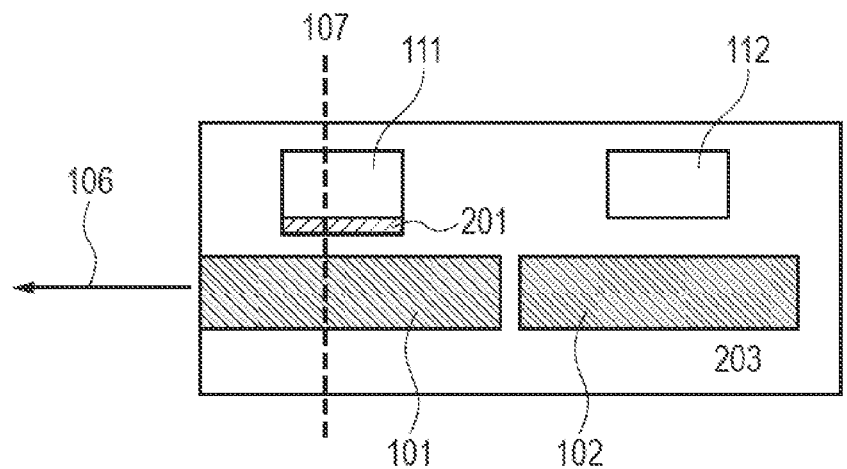
FIGS. 2A and 2B illustrate a constructional example of an SLD in Example 1 of the present invention.
Figure 2B:
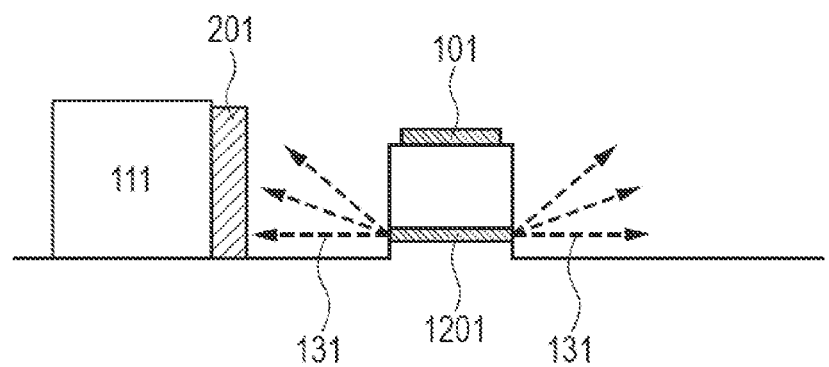

Specifically, a constructional example of an SLD (super luminescent diode) device in which an optical filter is added to a front-side light receiving portion is described with reference to FIGS. 2A and 2B. FIG. 2A illustrates a SLD device 203 when viewed from above, and FIG. 2B is a cross-sectional view taken along the dotted line 107 in FIG. 2A.

In this example, an optical filter 201 which selectively transmits a spontaneously emitted light component from a primary level is provided between a front-side light receiving portion 111 and an active layer region 1201 into which current is injected from a front electrode 101.

Figure 10:
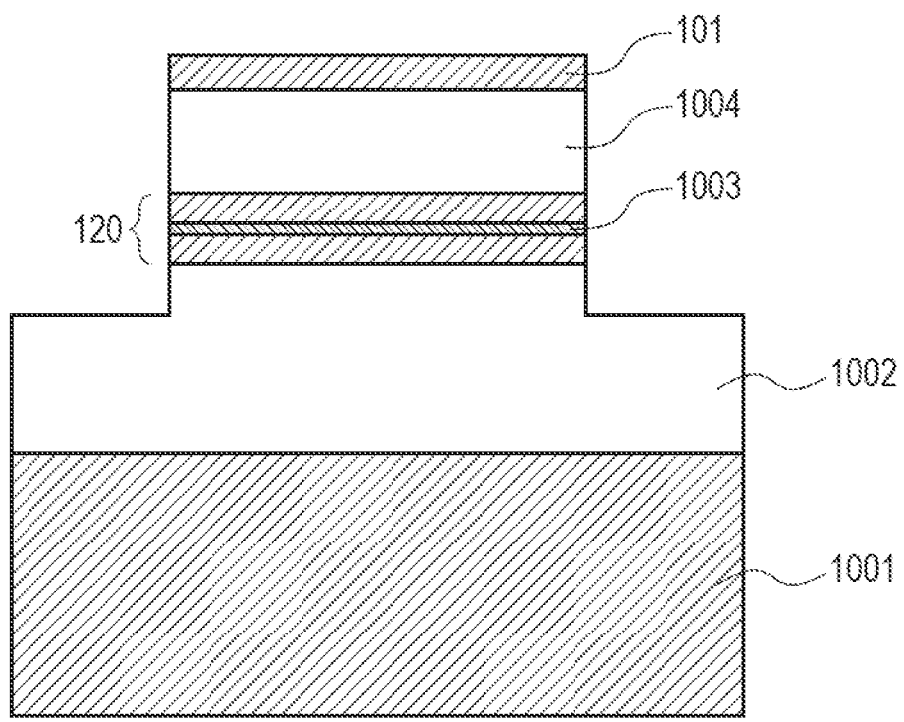
FIG. 10 illustrates a constructional example of a portion of the SLD device in Example 1 of the present invention excluding a light receiving portion.

Here, a constructional example of a portion of the SLD device excluding light receiving portions 111 and 112 is illustrated in FIG. 10.

From the bottom, an n-type doped GaAs substrate is first formed as a substrate 1001, and an n-type doped $Al_{0.5}GaAs$ layer is then formed as a lower cladding layer 1002 thereon. A quantum well/barrier layer of $GaIn_{0.07}As/Al_{0.2}GaAs$ is formed as an active layer 120 on this lower cladding layer, and a p-type doped $Al_{0.5}GaAs$ layer is formed as an upper cladding layer 1004. A p-type doped GaAs layer is formed as a contact layer (not illustrated) on this upper cladding layer. The thickness of the quantum well layer 1003 is controlled to 8 nm.

Etching is conducted up to the middle of the lower cladding layer 1002 to fabricate a ridge structure. In FIG. 10, the etching is conducted up to the lower cladding layer 1002. However, the ridge structure may be any structure so far as spontaneously emitted light from the quantum well layer 1003 leaks out. Accordingly, the etching may be stopped in the middle of the active layer 120 lower than the quantum well layer 1003.

Upper electrodes 101 and 102 are formed on the top of the ridge structure, and a passivation film (not illustrated) is formed around the ridge structure. The light receiving portions 111 and 112 are arranged to the SLD device fabricated in such a manner. In this example, such an optical filter that a transmission rate $T(\lambda)$ between a wavelength $\lambda 1$ and a wavelength $\lambda 2$ satisfies $T(\lambda 1) > T(\lambda 2)$ is arranged between the front-side light receiving portion 111 close to the exit side of the SLD light 106 and the front-side active layer region 1201.

Here, $\lambda 1$ means a luminescent peak wavelength from a primary level (second level; short-wavelength side level) in the active layer 120, and $\lambda 2$ means a luminescent peak wavelength from a ground level (first level; long-wavelength side level).

Specifically, in the case of the active layer structure of this example, the peak of the luminescence from the primary level appears at a wavelength of about 816 nm. For example, a band-pass filter whose center wavelength is 816 nm may be used.

At least a wavelength not shorter than an emission wavelength of 840 nm from the ground level is not transmitted, whereby detection accuracy can be improved, so that a filter whose center wavelength is 816 nm and which has a transmission wavelength characteristic of ±12 nm is favorable. In addition, one filter which fulfills a function of a short-pass filter of a wavelength not longer than 828 nm, which is an intermediate wavelength between the above wavelengths, may also be used.

By using such a construction, the value from the front-side light receiving portion 111 can be a value corresponding to the emission intensity from the primary level with better accuracy, so that controllability of the SLD light is improved by referring to this value.

By the way, when the temperature of the SLD device is controlled by, for example, a Peltier device so as to be a fixed temperature upon determination of a transmission wavelength band of the filter, change in emission wavelength may not be so considered. However, when the environmental temperature is changed, a change in emission wavelength attending on this needs to be considered.

For example, 6 nm and 7 nm thick $GaIn_{0.09}As$ and 10 nm thick $Al_{0.2}GaAs$ are used as the quantum well layer and the barrier layer, respectively, in the active layer, the wavelength from the primary level is changed by about 0.2 to 0.3 nm/K with the temperature change. Thus, it is necessary to consider a wavelength margin for that.

Example 2

Figure 4A:
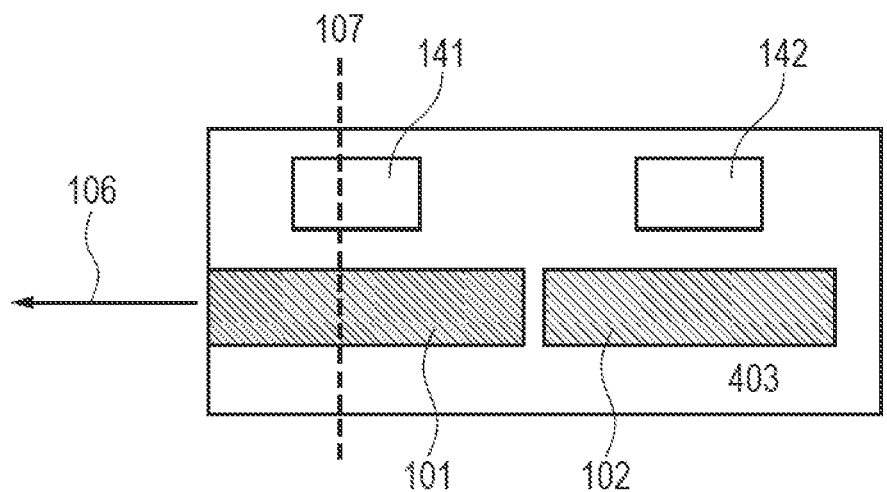
FIGS. 4A and 4B illustrate a constructional example of an SLD in Example 2 of the present invention.
Figure 4B:
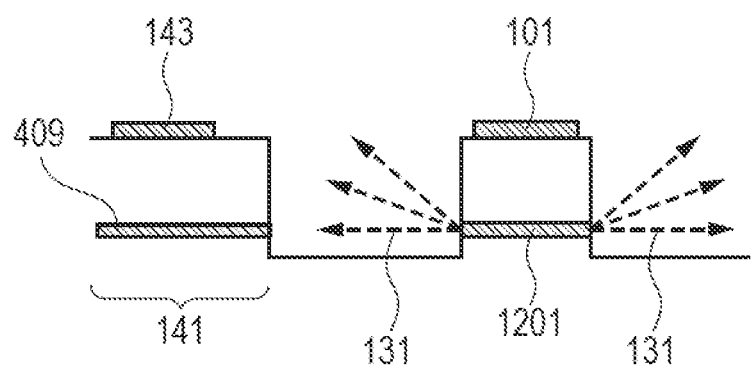

A constructional example of an SLD (super luminescent diode) device where a light absorbing portion of a light receiving portion is fabricated integrally with the SLD device is described as Example 2 with reference to FIGS. 4A and 4B. FIG. 4A illustrates the SLD device 403 when viewed from above, and FIG. 4B is a cross-sectional view taken along the dotted line 107 in FIG. 4A.

In this example, a light absorbing portion 409 of light receiving portions 141 and 142 is the same as an active layer 1201.

A reverse bias with respect to a front electrode 101 is applied to an upper electrode 143 of the light receiving portion 141, whereby the intensity of a spontaneously emitted light component 131 emitted from the active layer 1201 of the SLD portion can be detected at the light absorbing portion 409. Likewise, the light receiving portion 142 can be fabricated from the same active layer on the same substrate even to a rear electrode 102.

As described above, the light receiving portions and the SLD portion are monolithically fabricated, whereby alignment accuracy between the SLD portion and the light receiving portions can be improved, and production cost can be reduced.

Example 3

A constructional example where an active layer in plural luminescent portions is made common, and an optical filter is arranged between a luminescent region located on an opposite side to a light extraction side of a luminescent region closest to an end face of the light extraction side of longitudinal end faces of an optical waveguide layer and a light receiving portion for detecting an amount of spontaneously emitted light from the luminescent region located on the opposite side is described as Example 3.

Figure 6A:
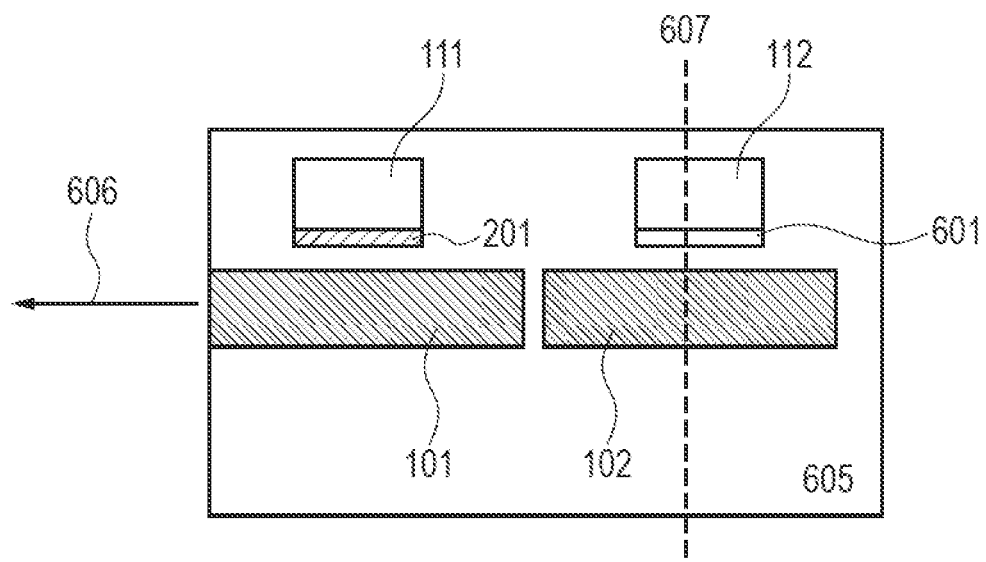
FIGS. 6A and 6B illustrate a constructional example of an SLD in Example 3 of the present invention.
Figure 6B:
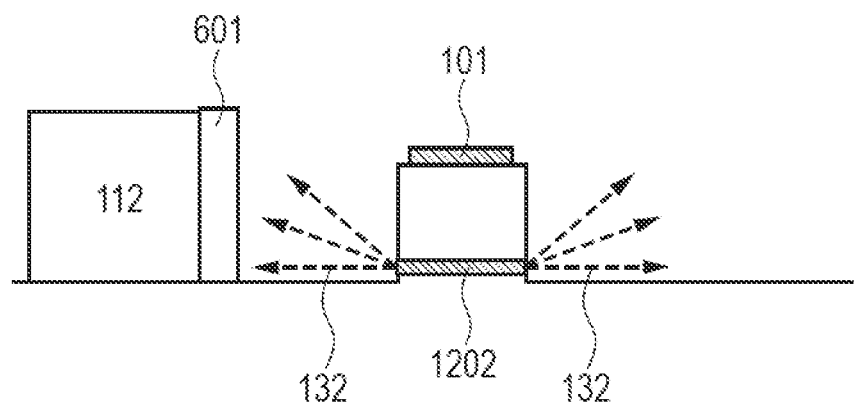

Specifically, a constructional example of an SLD (super luminescent diode) device in which an optical filter is also added to a light receiving portion on a rear electrode side is described with reference to FIGS. 6A and 6B. FIG. 6A illustrates a SLD device 605 when viewed from above, and FIG. 68B is a cross-sectional view taken along the dotted line 607 in FIG. 6A.

An optical filter 601 which selectively transmits a spontaneously emitted light component from a ground level is provided between a rear-side light receiving portion 112 and an active layer region 1202 into which current is injected from a rear electrode 102, unlike Example 1.

Supposing that a luminescent peak wavelength from a second level is λ1, and a luminescent peak wavelength from a first level is λ2, an optical filter satisfying the relationship of $T(\lambda 2) > T(\lambda 1)$ at a transmission rate $T(\lambda)$ between the wavelength λ1 and the wavelength λ2 is arranged.

When current is injected into the front electrode 101 and the rear electrode 102 and current injection amounts into the respective upper electrodes are intended to be adjusted while utilizing SLD light 606, the intensities of the spontaneously emitted light components are detected at the respective light receiving portions while conducting current injection into the respective upper electrodes. At this time, there is anxiety that light guided from a front-side active layer region 1201 (not illustrated) into which a high current has been injected diffracts in a rear-side active layer region 1202 and is detected in the rear-side light receiving portion 112.

According to this example, the filter 601 which selectively transmits the spontaneously emitted light component from the ground level is provided between the rear-side active layer region 1202 and the rear-side light receiving portion 112, whereby influence of the luminescence from the primary level by the diffracted light from the front-side active layer region 1201 can be removed even in such a case.

In addition, intensity change of the spontaneously emitted light near a target density of carrier in the rear-side active layer region 1202 can be more sensitively detected, so that the current injection amounts into the respective upper electrodes can be controlled at a higher speed with higher accuracy.

Example 4

Figure 7A:
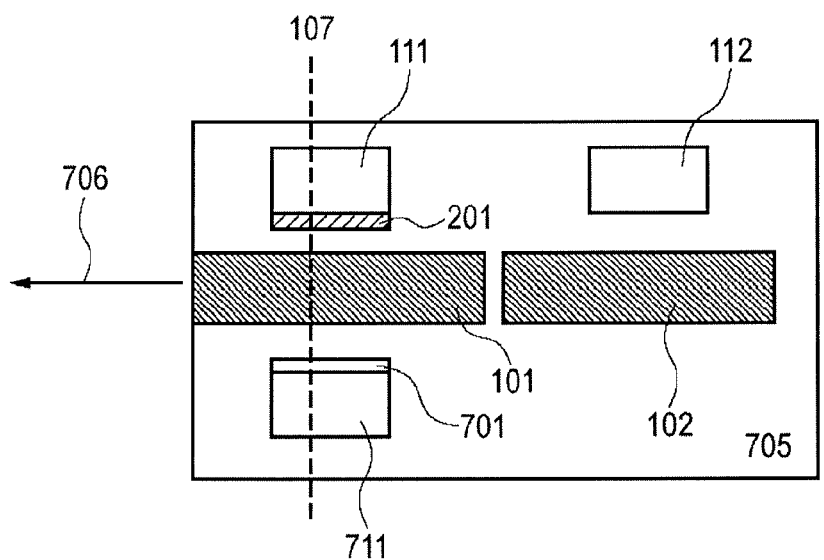
FIGS. 7A and 7B illustrate a constructional example of an SLD in Example 4 of the present invention.
Figure 7B:
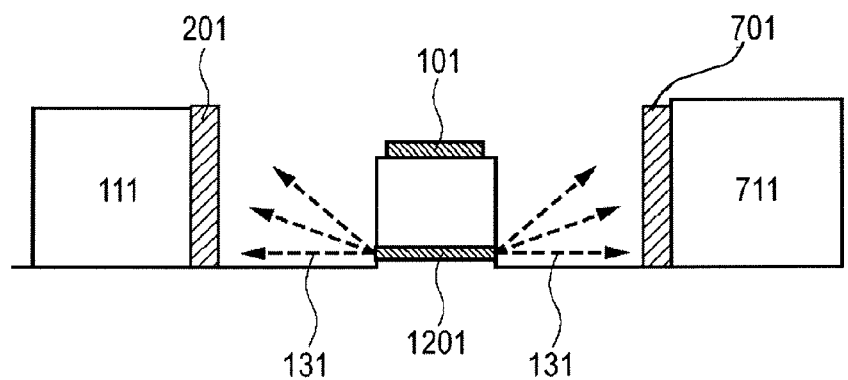
Figure 8A:
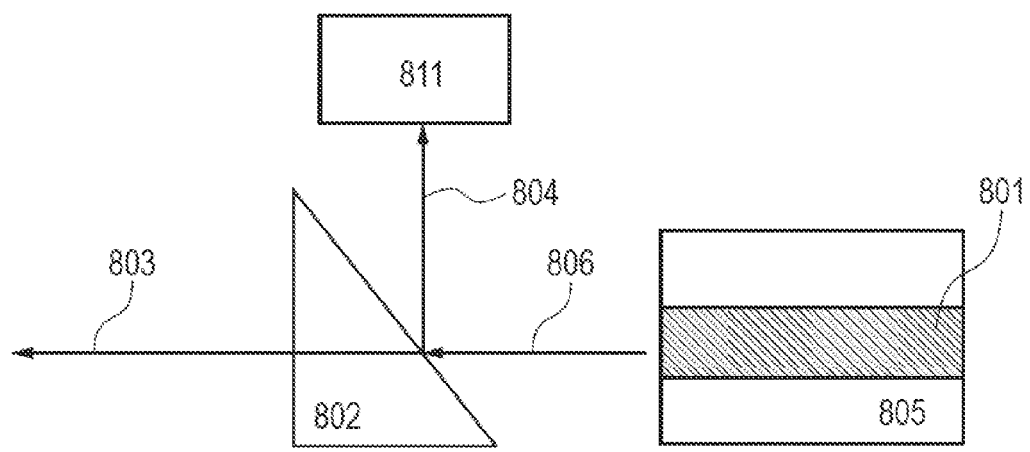
FIGS. 8A and 8B illustrate a constructional example of an SLD in a conventional example.
Figure 8B:
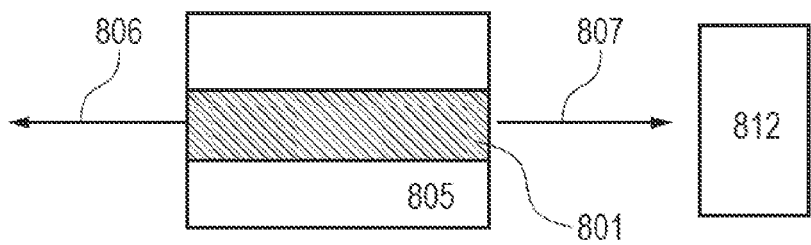
Figures 9A, 9B:
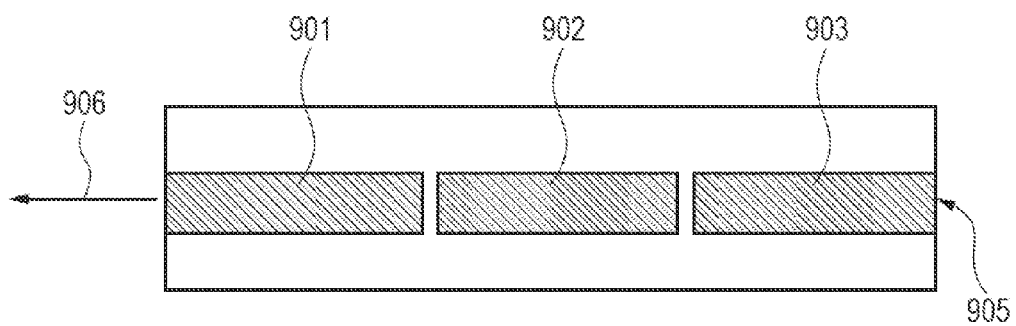
FIGS. 9A and 9B illustrate a constructional example of an SLD in another conventional example.

A constructional example of an SLD (super luminescent diode) device in which plural light receiving portions are provided on a front electrode side is described as Example 4 with reference to FIGS. 7A and 7B. FIG. 7A illustrates the SLD device 705 when viewed from above, and FIG. 7B is a cross-sectional view taken along the dotted line 107 in FIG. 7A.

Plural light detectors are installed for spontaneously emitted light 131 from an active layer region 1201 into which current is injected from a front electrode 101, unlike Example 1, and filters constituted in the following manner are provided.

An optical filter satisfying the relationship of $T(\lambda 1) > T(\lambda 2)$ at the above-described transmission rate $T(\lambda)$ between the wavelength λ1 and the wavelength λ2 is arranged between at least one light receiving portion of the plural light receiving portions and the luminescent region.

In addition, an optical filter satisfying the relationship of $T(\lambda 2) > T(\lambda 2)$ at the above-described transmission rate $T(\lambda)$ between the wavelength λ1 and the wavelength λ2 is arranged between another light receiving portion and the luminescent region.

A case where two light detectors are provided will hereinafter be described.

A light receiving portion 111 has a short-wavelength filter 201 which selectively transmits an emission wavelength from a primary level in the active layer region 1201 of the spontaneously emitted light 131 is provided between the light receiving portion 11 and the active layer region 1201.

On the other hand, a light receiving portion 711 has a long-wavelength filter 701 which selectively transmits an emission wavelength from a ground level in the active layer region 1201 of the spontaneously emitted light 131 is provided between the light receiving portion 711 and the active layer region 1201.

At least two peak intensities of the spontaneously emitted light 131 from the active layer region 1201 into which current is injected from the front electrode 101 are respectively detected.

Further, the intensity of spontaneously emitted light 132 (not illustrated) from an active layer region 1202 (not illustrated) into which current is injected from a rear electrode 102 is detected at a light receiving portion 112, whereby the current amounts injected into the two electrodes 101 and 102 can be controlled with higher accuracy.

Example 5

Figure 12:
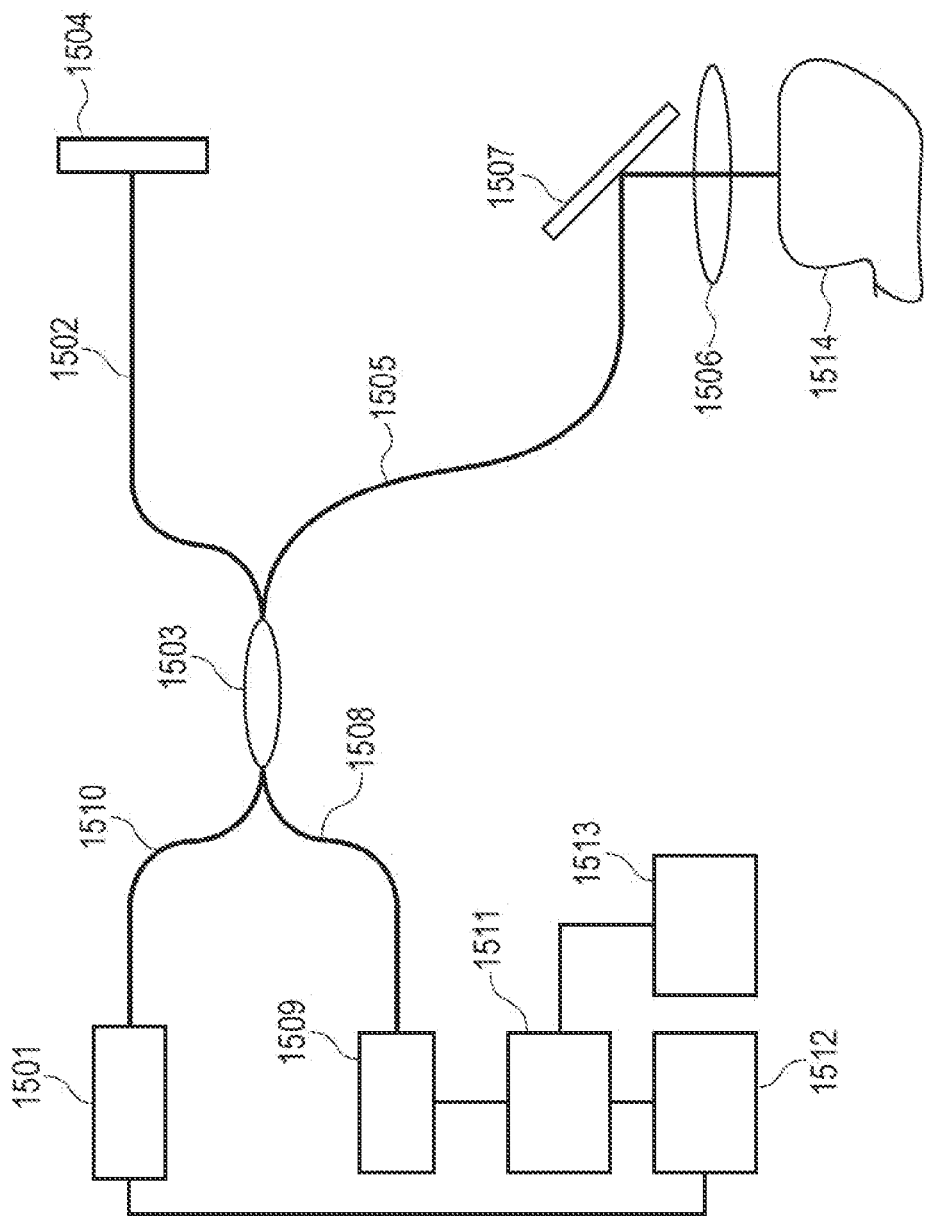
FIG. 12 illustrates a constructional example of an SLD in Example 5 of the present invention.

A constructional example of an optical coherence tomographic imaging apparatus (OCT apparatus) in which the SLD (super luminescent diode) device according to the present invention is applied as a light source device is described as Example 5 with reference to FIG. 12. As illustrated in FIG. 12, the OCT apparatus of this example is fundamentally provided with a sample measurement portion (1507 and the like) which applies, to a sample portion 1514, one measuring light obtained by splitting light from a light source portion (1501 and the like) by a fiber coupler 1503 and transmits reflected light from the sample portion. The OCT device includes a reference portion (1502 and the like) which applies another light obtained by the splitting by the fiber coupler 1503 to a reference mirror 1504 and transmits reflected light from the reference mirror. The OCT device further includes an interference portion (1503) of the fiber coupler in which the two reflected lights of the reflected light from the sample portion and the reflected light from the reference mirror are caused to interfere with each other, a light detection portion (1509 and the like) which detects interference light obtained by the interference portion, and an image processing portion (1511 and the like) which conducts image processing (to obtain a tomographic image) on the basis of light detected in the light detection portion.

The constructions of the respective portions will hereinafter be described.

The light source portion is constituted of an SLD light source 1501 and a light source control portion 1512 which controls the SLD light source, and the SLD light source 1501 is connected to the fiber coupler 1503 constituting the interference portion through an optical fiber 1501.

The fiber coupler 1503 of the interference portion is formed of those of a single mode in a wavelength band of the light source, and the fiber coupler is constituted of a 3 dB coupler.

The reflecting mirror (reference mirror) 1504 is connected to a fiber 1502 for an optical path of reference light to constitute the reference portion, and the fiber 1502 is connected to the fiber coupler 1503.

The measurement portion is constituted of a fiber 1505 for an optical path of the measuring light, a light applying and condensing optical system 1506 and an application position scanning mirror 1507, and the fiber 1505 for the optical path of the measuring light is connected to the fiber coupler 1503.

In the fiber coupler 1503, back-scattered light generated from the interior and surface of the sample 1514 interferes with a return light from the reference portion to generate interference light.

The light detection portion is constituted of a light receiving fiber 1508 and a photodetector 1509, and the interference light generated in the fiber coupler 1503 is guided to the photodetector 1509. The light received in the photodetector 1509 is converted to a spectrum signal by a signal processor 1511, and Fourier transform is further performed to obtain depth information of the sample.

The thus-obtained depth information is displayed as a tomographic image on an image output monitor 1513. Here, the signal processor 1511 can be constituted of, for example, a personal computer, and the image output monitor 1513 can be constituted of a display screen of the personal computer.

The light source control portion 1512 is connected to the signal processor 1511 which also controls a driving signal of the application position scanning mirror 1507 to control the SLD light source 1501 in synchronism with the driving of the scanning mirror 1507.

When the SLD (super luminescent diode) device described in Examples 1 to 4 is used as the SLD light source 1501 of this example, tomographic image information good in SN and high in depth resolution can be obtained at a high speed, because this light source device is high in output and permits obtaining information over a wide bond.

In addition, since the current injection amounts into the plural upper electrodes can be controlled at a high speed with good accuracy, dead time for adjustment is short, and so the apparatus can be used more efficiently. This OCT apparatus is useful for tomographic imaging in, for example, ophthalmology, dental surgery and dermatology. Incidentally, an example of the OCT apparatus has been described in this example. However, the present invention is not limited thereto, and the SLD device may be used as a light source of other OCT apparatus.

According to the present invention, there can be provided an SLD device by which the optical output and spectral form of exiting light can be simply controlled in a short period of time with good accuracy when an upper electrode or lower electrode is formed of plural electrodes, an optical coherence tomographic imaging apparatus provided with the SLD device, and a control method of the SLD device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-275123, filed Dec. 17, 2012, which is hereby incorporated by reference herein in its entirety.

What is claimed is:

1. A luminescent device comprising an upper electrode layer, a lower electrode layer and an active layer provided between these electrode layers, the device having such a structure that at least one electrode layer of the upper electrode layer and the lower electrode layer is provided in an in-plane direction of the active layer being divided into plural electrodes, currents are injected into plural different regions of the active layer by the plural electrodes to cause emission in plural luminescent regions, and light emitted from one luminescent region of the plural luminescent regions enters in another luminescent region and exits,
wherein the device further comprises plural light receiving portions for detecting light that is emitted from each of the plural luminescent regions and does not go through another luminescent region, and
wherein the device further comprises a control portion which controls a current injected into the active layer according to the intensity of the light detected by the plural light receiving portions.

2. The luminescent device according to claim 1, which has such a structure that in an emission spectrum on an exiting side of light emission from an active layer in the luminescent device, a dominant luminescence peak from the luminescent region is shifted from a long wavelength luminescence to a short wavelength luminescence by controlling densities of carriers injected from the upper electrode or the lower electrode.

3. The luminescent device according to claim 1, wherein at least a part of the active layer in the plural luminescent regions is provided with a common structure.

4. The luminescent device according to claim 1, wherein the light receiving portion has the same active layer as an active layer on a substrate.

5. The luminescent device according to claim 2, wherein a luminescent peak wavelength from the short-wavelength side is $\lambda 1$ and a luminescent peak wavelength from the long-wavelength side is $\lambda 2$, an optical filter satisfying the relationship of $T(\lambda 1) > T(\lambda 2)$ at a transmission rate $T(\lambda)$ between the wavelength $\lambda 1$ and the wavelength $\lambda 2$ is arranged between a luminescent region closest to an end face on a light extraction side of the active layer and the light receiving portion.

6. The luminescent device according to claim 5, wherein the active layer in the plural luminescent regions is common, and an optical filter satisfying the relationship of $T(\lambda 2) > T(\lambda 1)$ at the transmission rate $T(\lambda)$ between the wavelength $\lambda 1$ and the wavelength $\lambda 2$ is arranged between a luminescent region which is not closest to the end face of the light extraction side with respect to the luminescent region closest to the end face of the light extraction side of the longitudinal end faces of the active layer and a light receiving portion for detecting an amount of spontaneously emitted light from the luminescent region which is not closest to the end face of the light extraction side.

7. The luminescent device according to claim 5, wherein plural light receiving portions for detecting emitted light from the luminescent region closest to the end face on the light extraction side of the longitudinal end faces of the active layer are arranged for the luminescent region, an optical filter satisfying the relationship of $T(\lambda 1) > T(\lambda 2)$ at the transmission rate $T(\lambda)$ between the wavelength $\lambda 1$ and the wavelength $\lambda 2$ is arranged between at least one light receiving portion of the plural light receiving portions and the luminescent region, and an optical filter satisfying the relationship of $T(\lambda 2) > T(\lambda 1)$ at the transmission rate $T(\lambda)$ between the wavelength $\lambda 1$ and the wavelength $\lambda 2$ is arranged between another light receiving portion and the luminescent region.

8. The luminescent device according to claim 1, which has a structure in which a part of the emitted light from the luminescent region is shielded with a light shielding member.

9. The luminescent device according to claim 1, wherein the luminescent device is a super luminescent diode.

10. The luminescent device according to claim 1, wherein an optical waveguide is formed of a lower cladding layer provided between the active layer and the lower electrode layer and an upper cladding layer provided between the active layer and the upper electrode layer.

11. An optical coherence tomographic imaging apparatus comprising
the luminescent device according to claim 1 as a light source portion,
a sample measurement portion which applies light from the light source portion to a sample and transmits reflected light from the sample,
a reference portion which applies light from the light source to a reference mirror and transmits reflected light from the reference mirror,
an interference portion which causes the reflected light from the sample measurement portion and the reflected light from the reference portion to interfere with each other,
a light detection portion which detects interference light from the interference portion, and
an image processing portion which obtains a tomographic image of the sample on the basis of light detected at the light detection portion.

12. The luminescent device according to claim 1;
wherein the control portion is so configured as to be able to perform the following steps:
providing a table as to the relationship of an intensity value of detected by the light receiving portion with respect to the optical output and spectrum half width of the luminescent device,
determining a range of the value detected by the light receiving portion under a condition of using the light of the luminescent device, and
adjusting an amount of current to be injected into the upper electrode or the lower electrode on the basis of the table in such a manner that the value detected by the light receiving portion falls within the above range.

13. The luminescent device according to claim 1, wherein the control portion is so configured as to be able to perform the following step:
providing an operation expression as to the relationship of the intensity value of the spontaneously emitted light form the luminescent region detected by the light receiving portion with respect to the optical output and spectrum half width of the luminescent device.

* * * * *